(12) United States Patent
Canepa et al.

(10) Patent No.: US 10,229,000 B2
(45) Date of Patent: Mar. 12, 2019

(54) ERASURE CODES TO PREVENT LOWER PAGE CORRUPTION IN FLASH MEMORY

(71) Applicant: Seagate Technology LLC, Longmont, CO (US)

(72) Inventors: Timothy Canepa, Longmont, CO (US); Stephen Hanna, Longmont, CO (US)

(73) Assignee: Seagate LLC, Cupertino, CA (US)

( * ) Notice: Subject to any disclaimer, the term of this patent is extended or adjusted under 35 U.S.C. 154(b) by 44 days.

(21) Appl. No.: 15/232,058

(22) Filed: Aug. 9, 2016

(65) Prior Publication Data

US 2018/0046543 A1    Feb. 15, 2018

(51) Int. Cl.
| | |
|---|---|
| *G06F 11/10* | (2006.01) |
| *H03M 13/15* | (2006.01) |
| *G11C 16/22* | (2006.01) |
| *G11C 29/52* | (2006.01) |
| *G11C 11/56* | (2006.01) |
| *G11C 16/14* | (2006.01) |
| *H03M 13/11* | (2006.01) |

(52) U.S. Cl.
CPC ...... *G06F 11/1072* (2013.01); *G11C 11/5628* (2013.01); *G11C 11/5635* (2013.01); *G11C 16/14* (2013.01); *G11C 16/22* (2013.01); *G11C 29/52* (2013.01); *H03M 13/154* (2013.01); *G11C 2211/5641* (2013.01); *H03M 13/11* (2013.01)

(58) Field of Classification Search
CPC .. G06F 11/10; G06F 11/1012; G06F 11/1028; G06F 11/1048; G06F 11/1068; G06F 11/1072; G06F 12/02; G06F 12/0238; G06F 12/16; G06F 2212/72; G06F 2212/7202; G06F 2212/7203; G06F 2212/7205; G06F 2212/7207; G06F 2212/7209; G11C 11/5635; G11C 16/14; G11C 16/22; G11C 29/52; H03M 13/11; H03M 13/154
See application file for complete search history.

(56) References Cited

U.S. PATENT DOCUMENTS

| | | |
|---|---|---|
| 7,818,525 B1 | 10/2010 | Frost et al. |
| 8,751,735 B2 | 6/2014 | Zhao et al. |
| 8,935,595 B2 | 1/2015 | Zhong et al. |
| 8,949,517 B2 | 2/2015 | Cohen et al. |
| 9,032,271 B2 | 5/2015 | Sun et al. |

(Continued)

FOREIGN PATENT DOCUMENTS

WO    2013147923 A1    10/2013

*Primary Examiner* — Christian M Dorman
(74) *Attorney, Agent, or Firm* — FisherBroyles LLP; Gregory T. Fettig

(57) ABSTRACT

Methods and structure for preventing lower page corruption in flash memory. One embodiment is a flash storage device that includes Multi-Level Cell (MLC) flash memory, Single-Level Cell (SLC) flash memory, and a controller coupled to the MLC flash memory and the SLC flash memory. The controller is configured to program host data to a lower page of the MLC flash memory, to generate an erasure code for the host data, and to store the erasure code in the SLC flash memory. The controller is also configured to detect an interrupted write operation to an upper page linked to the lower page, to retrieve the erasure code from the SLC flash memory, and to correct the host data of the lower page of the MLC flash memory using the erasure code.

11 Claims, 6 Drawing Sheets

(56) References Cited

U.S. PATENT DOCUMENTS

| | | |
|---|---|---|
| 9,141,308 B2 | 9/2015 | Lassa et al. |
| 2013/0173844 A1 | 7/2013 | Chen et al. |
| 2014/0095770 A1 | 4/2014 | Huang et al. |
| 2014/0133220 A1 | 5/2014 | Danilak et al. |
| 2014/0258588 A1* | 9/2014 | Tomlin ................ G06F 12/0246 711/103 |
| 2014/0269053 A1* | 9/2014 | Chen ........................ G11C 7/24 365/185.03 |
| 2014/0281599 A1 | 9/2014 | Grimsrud et al. |
| 2015/0039824 A1 | 2/2015 | Furlong |
| 2015/0089325 A1* | 3/2015 | Chandrasekhar ... G06F 11/1072 714/766 |
| 2016/0092138 A1 | 3/2016 | Knestele et al. |
| 2017/0322843 A1* | 11/2017 | Hsu .................... G06F 11/1072 |

* cited by examiner

ERASURE CODES TO PREVENT LOWER PAGE CORRUPTION IN FLASH MEMORY

FIELD

The invention relates generally to storage systems and more specifically relates to using erasure codes to prevent lower page corruption in flash memory.

BACKGROUND

Many commonly used data storage devices, such as Solid State Drives (SSDs), are based on flash memory, a type of Non-Volatile Random Access Memory (NVRAM) capable of storing data even if the power to the device is switched off. A memory cell within a flash array is typically a floating gate field-effect transistor that holds a charge to indicate stored data. In Single-Level Cell (SLC) flash, the charge indicates one of two possible states ("1" or "0") such that a single memory cell stores one bit of data. By contrast, Multi-Level Cell (MLC) flash uses additional charge states (e.g., "00", "01", "10", or "11") to enable a single memory cell to store two bits of data or more. The storage capacity in MLC flash may therefore be twice (or more) than that achieved in SLC flash using the same number of transistors, though there may be other tradeoff considerations such as latency and lifespan of the memory cells.

MLC flash writes may be performed in two steps, where a lower page is programmed first similar to an SLC flash write (i.e., "1" or "0") and then an upper page is programmed later to tune the cell voltage (i.e., from "1" to "10" or "11" or from "0" to "00" or "01") to indicate the second bit of the memory cell. This two-step programming sequence prevents cell-to-cell interference which can corrupt bit values in neighboring cells. However, if power is unexpectedly lost in an MLC flash memory device during an upper page program operation to a memory cell, data which has been previously written to the lower page of that memory cell may become corrupted. The user is therefore at a risk of losing not only data which is in-flight at the time of the power loss event, but also data which was already successfully written in flash memory which a user typically expects to be safe regardless of any loss of power to the device.

SUMMARY

In one embodiment, a flash storage device includes Multi-Level Cell (MLC) flash memory, Single-Level Cell (SLC) flash memory, and a controller coupled to the MLC flash memory and the SLC flash memory. The controller is configured to program host data to a lower page of the MLC flash memory, to generate an erasure code for the host data, and to store the erasure code in the SLC flash memory. The controller is also configured to detect an interrupted write operation to an upper page linked to the lower page, to retrieve the erasure code from the SLC flash memory, and to correct the host data of the lower page of the MLC flash memory using the erasure code.

Other exemplary embodiments (e.g., methods and computer-readable media relating to the foregoing embodiments) are described below.

DESCRIPTION OF THE DRAWINGS

Some embodiments of the present invention are now described, by way of example only, and with reference to the accompanying drawings. The same reference number represents the same element or the same type of element on all drawings.

DESCRIPTION

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments, and are to be construed as being without limitation to such specifically recited examples and conditions. As a result, the inventive concept(s) is not limited to the specific embodiments or examples described below, but by the claims and their equivalents.

Figure 1:
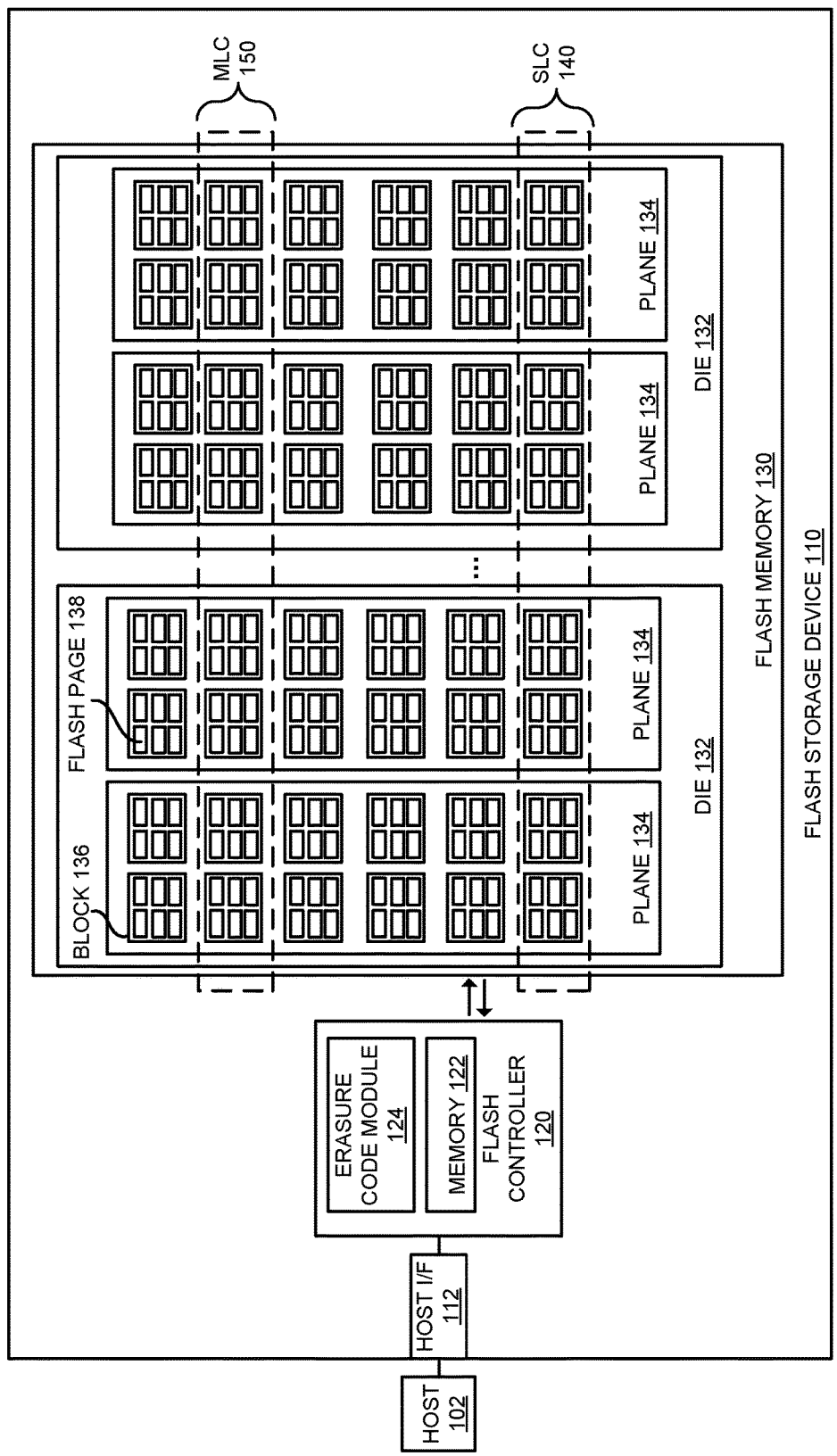
FIG. 1 is a block diagram of a flash storage device in an exemplary embodiment.

FIG. 1 is a block diagram of a flash storage system 100 in an exemplary embodiment. Flash storage system 100 includes a host 102 (e.g., a computer system, a mobile phone, etc.) operable to issue storage commands. Flash storage system 100 also includes a flash storage device 110. Flash storage device 110 includes a host interface (I/F) 112, a flash controller 120, and one or more arrays of flash memory 130. Host I/F 112 provides physical and electrical connections to facilitate communication of data, commands, and/or control signals between host 102 and flash storage device 110. Flash controller 120 is any system, component, or device operable to control the operations of flash storage device 110 for storage and retrieval of data in flash memory 130 in accordance with commands received from host 102.

Flash memory 130 comprises one or more die 132 (e.g., one, two, four, etc.) each operable to independently execute commands or report statuses. Each die 132 may include one or more planes 134 (typically two or four) in which concurrent operations may take place, and each plane 134 may include a number of blocks 136 (e.g., dozens or hundreds), which in turn may each contain a number of flash pages 138 (e.g., 8, 16, 32, 64, etc.). Generally, in flash architectures, a block 136 may represent the smallest unit that may be erased in a single erase operation, and a flash page 138 may represent the smallest unit that may be programmed (i.e., written to) or read in a single write or read operation. Each flash page 138 may include thousands or tens of thousands of bits, with each bit implemented by a memory cell.

Memory cells of flash memory 130 may collectively implement single-level cell (SLC) memory 140, multi-level cell (MCL) memory 150, or some combination thereof. In SLC memory 140, each memory cell stores a single bit. By contrast, in MLC memory 150, each memory cell stores two bits or more. Therefore, in MLC, a "lower page" of a memory cell stores a less-significant bit, and an "upper page" of the same memory cell stores a more-significant bit. The terms lower page and upper page in the context of MLC flash memory is different than the term flash page (e.g., flash page 138 of FIG. 1) which refers to a unit of data that is addressable by a controller. For instance, each flash page 138 may contain thousands of bytes (e.g., 4 KB, 8 KB, etc.), and different bits of a memory cell in MLC memory 150 may belong to different flash pages 138.

One type of problem which occurs in MLC type flash memory is that a power failure during upper page programming may corrupt the already-written data in the corresponding lower page. Thus, data in the lower page may not be recovered after the power is restored even though that data was successfully written and at-rest for a period of time (e.g., a fraction of a second, a day, a week, etc.). Previous systems include large capacitors capable of providing backup power while all outstanding write operations and shutdown procedures to properly complete but at the expense of manufacturing cost and space footprint of the memory device. Other previous systems forego the benefits of MLC memory and use SLC memory to store commands from the host. However, a fully cached SLC host interface achieves comparatively less memory density.

Flash controller 120 is therefore enhanced to include an erasure code module 124 which is any system, component, or device operable to use erasure codes to recover data from corrupted lower pages of MLC flash memory. As will be described in greater detail below, erasure code module 124 may direct operations to a combination of SLC memory 140 and MLC memory 150 of flash memory 130. These operations allow commands from host 102 to be stored in MLC memory 150 for increased storage capacity while preventing lower page corruption in MLC memory 150 and without reliance on large backup capacitors.

Flash controller 120 includes memory 122 that is operable to store tables, data, status indicators, etc. useful to flash controller 120 for storage management of flash memory 130. For instance, flash controller 120 may use memory 122 to store address mapping tables or lookup tables to convert logical data addresses used by host 102 into virtual and/or physical addresses corresponding to portions of flash memory 130. Alternatively or additionally, flash controller 120 may buffer or cache commands (e.g., read/write operations from host 102) and/or data in memory 122 before performing operations requested by host 102. Memory 122 may be implemented using dynamic random access memory (DRAM), static random access memory (SRAM), or other types of memory.

Flash controller 120 may be implemented as custom circuitry, as a special or general purpose processor executing programmed instructions stored in an associated program memory, or some combination thereof. Connections and communications within flash storage device 110 or via host I/F 112 may be based on a proprietary interface or a standard interface such as Universal Serial Bus (USB), Fiber-Channel, Serial Advanced Technology Attachment (SATA), Small Computer System Interface (SCSI), etc. Flash memory 130 (including SLC memory 140 and MLC memory 150) may be implemented as NAND flash memory. The particular arrangement of components described with respect to flash storage system 100 is merely intended to be exemplary, and one of ordinary skill in the art will appreciate that alternative arrangements, number of components, etc. are possible.

Figure 2:
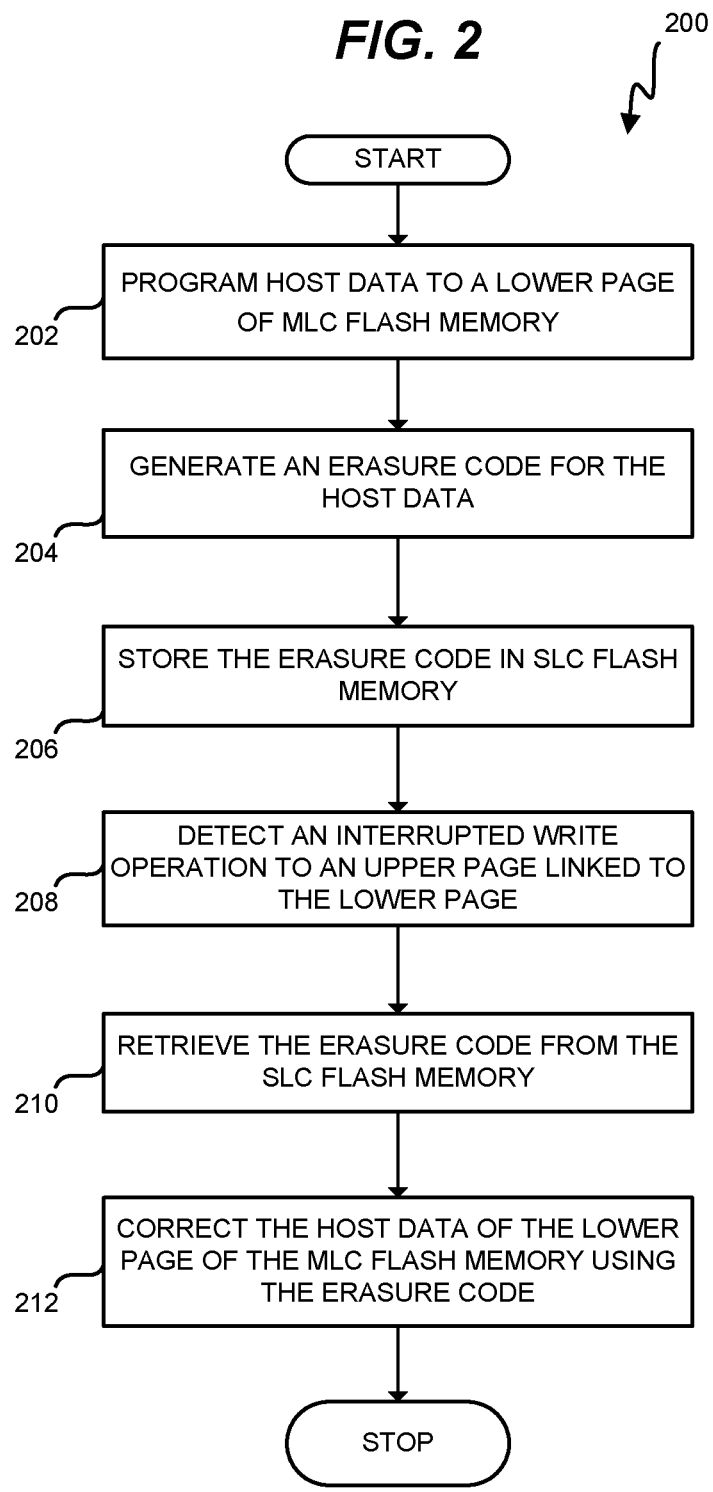
FIG. 2 is a flowchart describing an exemplary method to prevent lower page corruption in flash memory.

Further details of the operation of flash storage system 100 will be described with regard to FIG. 2, which is a flowchart describing an exemplary method 200 to prevent lower page corruption in flash memory 130. Although steps of method 200 are described with reference to flash storage device 100 of FIG. 1, method 200 may be performed in other systems. The steps of the flowcharts described herein are not all inclusive, may include other steps not shown, and may be performed in alternative orders. Assume, for this embodiment, that flash controller 120 is actively managing and caching read/write operations received from one or more hosts 102 that are directed to flash memory 130 of flash storage device 110.

In step 202, flash controller 120 programs data received from host 102 to a lower page of MLC memory 150. A lower page of a memory cell in MLC memory 150 is generally programmed prior to programming an upper page linked to the same memory cell. Therefore, the upper page may remain unprogrammed (e.g., the memory cell voltage is not further tuned) for a period of time after programming the lower page.

In step 204, erasure code module 124 generates an erasure code for the host data. In doing so, erasure code module 124 may encode the host data with one or more code bits based on an error correction technique such as parity, Bose-Chaudhuri-Hocquenghem (BCH), Reed Solomon, etc. Erasure code module 124 may generate erasure codes for host data which is either intended for MLC memory 150 but not yet stored in MLC memory 150, or which has been partially or completely stored in MLC memory 150. Erasure code module 124 may generate one erasure code that covers a plurality of N lower pages, where N is an integer greater than one.

In step 206, erasure code module 124 stores the erasure code in SLC memory 140. Thus, although associated with host data stored in MLC memory 150, the code bits for that host data may be separately stored in SLC memory 140. Since SLC memory 140 is not susceptible to lower page corruption the erasure codes are stored with a high degree of reliability.

In step 208, flash controller 120 detects an interrupted write operation to an upper page that is linked with the lower page. Flash controller 120 may detect the write interrupt after power is restored based on an improper shutdown log message or flag that indicates power failure to flash storage device 110 or flash memory 130. As previously described, power failure during programming of a higher-order page may corrupt the data previously stored (e.g., in step 202) in a lower-order page for that memory cell.

In step 210, erasure code module 124 retrieves the erasure code from SLC memory 140. In doing so, erasure code module 124 may identify/retrieve units of host data in MLC memory 150 that are at risk of corruption as a result of the power loss event, and identify/retrieve the associated erasure codes stored in SLC memory 140. Erasure code module 124 may cache retrieved host data and/or erasure codes in memory 122 of flash controller 120.

In step 212, erasure code module 124 corrects the host data of the lower page of MLC memory 150 using the erasure code. In doing so, erasure code module 124 may decode a unit of at-risk host data with its corresponding code bits according to the encoding technique used for that data. Erasure code module 124 may then program the decoded host data into MLC memory 150 to its original location or an updated location of flash memory 130.

Using the steps of method 200, storage controller 110 may generate/retrieve erasure codes for host write requests in a manner that allows full recovery of corrupted lower page(s) in MLC memory 150 in a power loss event without reliance on large backup capacitors. Each erasure code may protect N lower pages in MLC memory 150 so that flash storage device 110 may withstand the loss of N lower pages as a result of power loss and still recover the data. Additionally, as will be described in greater detail below, erasure code module 124 may direct the programming of upper pages of MLC memory 125 (e.g., the number of dies 132 active at a time for upper page writes) based on the number of lower pages N that may be recovered with an erasure code.

Figure 3:
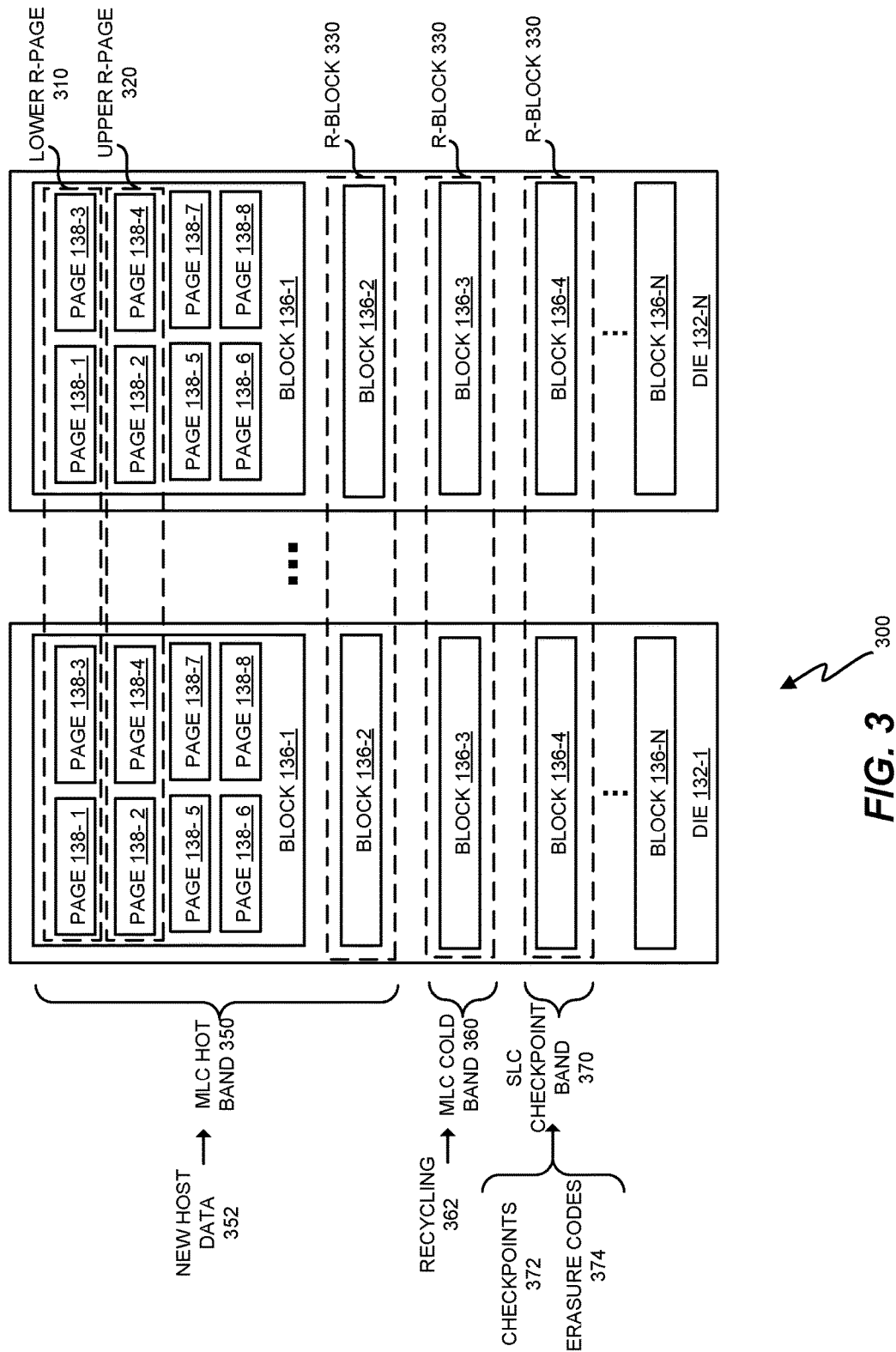
FIG. 3 is a block diagram of flash memory in an exemplary embodiment.

FIG. 3 is a block diagram of flash memory 300 in an exemplary embodiment. In flash memory 300, flash controller 120 may perform operations in larger data units referred to as R-pages and R-blocks. An R-block 330 is a combination of blocks 136 combined or logically linked across multiple separate die 132. For example, an R-block 330 may include one block from each die 132 (e.g., die 132-1 through 132-N). However, flash controller 120 may form R-blocks 330 from any combination of blocks 136 to adapt the amount of data available for storage to a unit of operation or activity of a host 102. Additionally, R-blocks 330 need not be restricted to the same relative block locations across multiple die 132.

Each R-block 330 may include multiple R-pages that logically link a flash page 138 (or subset of flash pages) belonging to different blocks 136 or die 132. For MLC memory 150, a lower R-page 310 may link one or multiple lower pages (e.g., odd numbered pages 138-1, 138-3, etc.) from an individual block 136 across multiple die 132, and an upper R-page 320 may link one or multiple upper pages (e.g., even numbered pages 138-2, 138-4, etc.) from an individual block 136 across multiple die 132. Flash controller 120 may also form R-pages in any combination unrestricted by any relative locations within blocks 136 or die 132.

The R-block/R-page configuration of flash memory 300 enables flash controller 120 to operate on a plurality of channels, or streams, for parallel write operations across die 132. Flash controller 120 may write data to initially fill a flash page 138, followed by a number of flash pages 138 to fill an R-page, followed by a number of R-pages to fill an R-block 330, and then a number of R-blocks 330. Alternatively or additionally, flash controller 120 may accumulate a cache of writes in memory 122 and perform write operations in a striped fashion.

Flash memory 300 also includes a hot data band 350, a cold data band 360, and a checkpoint band 370. Each band 350/360/370 may comprise a collection of R-blocks 330 populated with information having similar properties and/or characteristics within a band. Flash controller 120 thus directs new host data 352 to hot band 350, directs recycling activity 362 (e.g., garbage collection) to cold band 360, and directs checkpoints 372 (e.g., map entries/tables and other state information) to checkpoint band 370. The separation of hot, cold, and checkpoint data enables flash controller 120 to efficiently perform a number of different data management functions including read/write operations, wear-leveling operations, etc.

To enhance the operations of flash controller 120, erasure code module directs erasure codes 374 to checkpoint band 370 in SLC memory 140. Thus, erasure code module 124 enables flash memory 300 to establish hot band 350 and cold band 360 in MLC memory 150 and checkpoint band 370 in SLC memory 140. Storage of erasure codes 374 in checkpoint band 370 of SLC memory 140 provides reliable lower page protection of MLC memory 150 with minimal tenure in flash controller 120 to improve buffer performance while also enabling retrieval of lower page protection records to be integrated with the normal recovery process after a power failure.

MLC memory 150 and SLC memory 140 may be distinguished from one another by programming rules for the memory cells rather than any physical different in the structure of the memory cells. Thus, erasure code module 124 may direct flash controller 120 to perform MLC programming operations (e.g., two-step writes to linked upper/lower pages) or SLC programming operations (e.g., one-step writes to unlinked singular pages) to designate MLC memory 150 and SLC memory 140, respectively, in flash memory 300. Alternatively or additionally, erasure code module 124 may assign, detect, or designate an association of bands 350/360/370 to SLC memory 140 or MLC memory 150 according to system configuration settings, user commands, etc. Other arrangements of flash memory 300 are possible, including additional or alternative bands, alternative designations to MLC/SLC memory types, etc. Further details of the operation of erasure code module 124 are described below.

Figure 4:
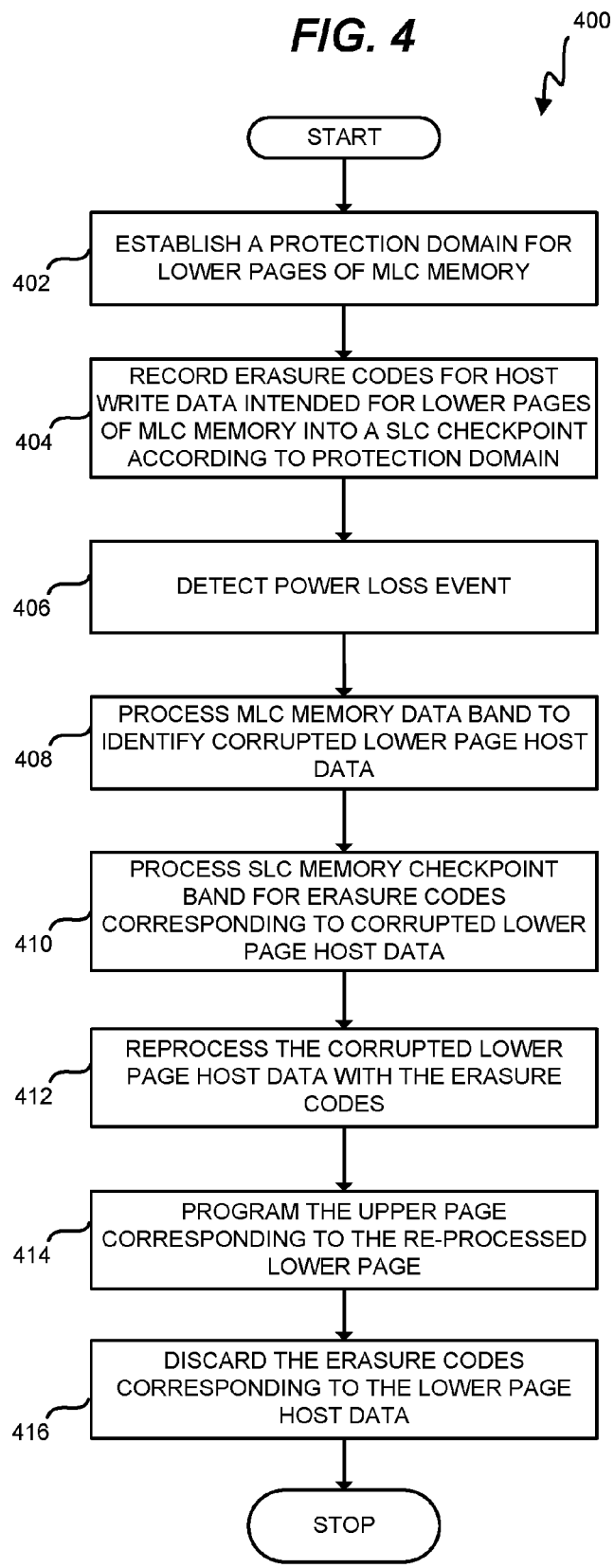
FIG. 4 is a flowchart describing an exemplary method to prevent lower page corruption in flash memory.

FIG. 4 is a flowchart describing an exemplary method 400 to prevent lower page corruption in flash memory 300. The flowcharts described herein are not all inclusive, may include other steps not shown, and may be performed in alternative orders or in alternative systems.

In step 402, erasure code module 124 establishes a protection domain for lower pages of MLC memory 150. A protection domain generally defines the parameters for processing erasure codes such as the type of encoding technique or combination of encoding techniques, the number of available/active die 132, a size of the erasure code, etc. Erasure code module 124 may select/configure/update the protection domain or parameters thereof based on a desired level of protection (e.g., according to user/vendor specifications), programming properties of flash memory device 110, settings stored in memory 122, or some combination thereof. As discussed in greater detail below, erasure code module 124 may additionally implement a protection domain that also covers upper pages of MLC memory 150 for full R-page protection.

Figure 5:
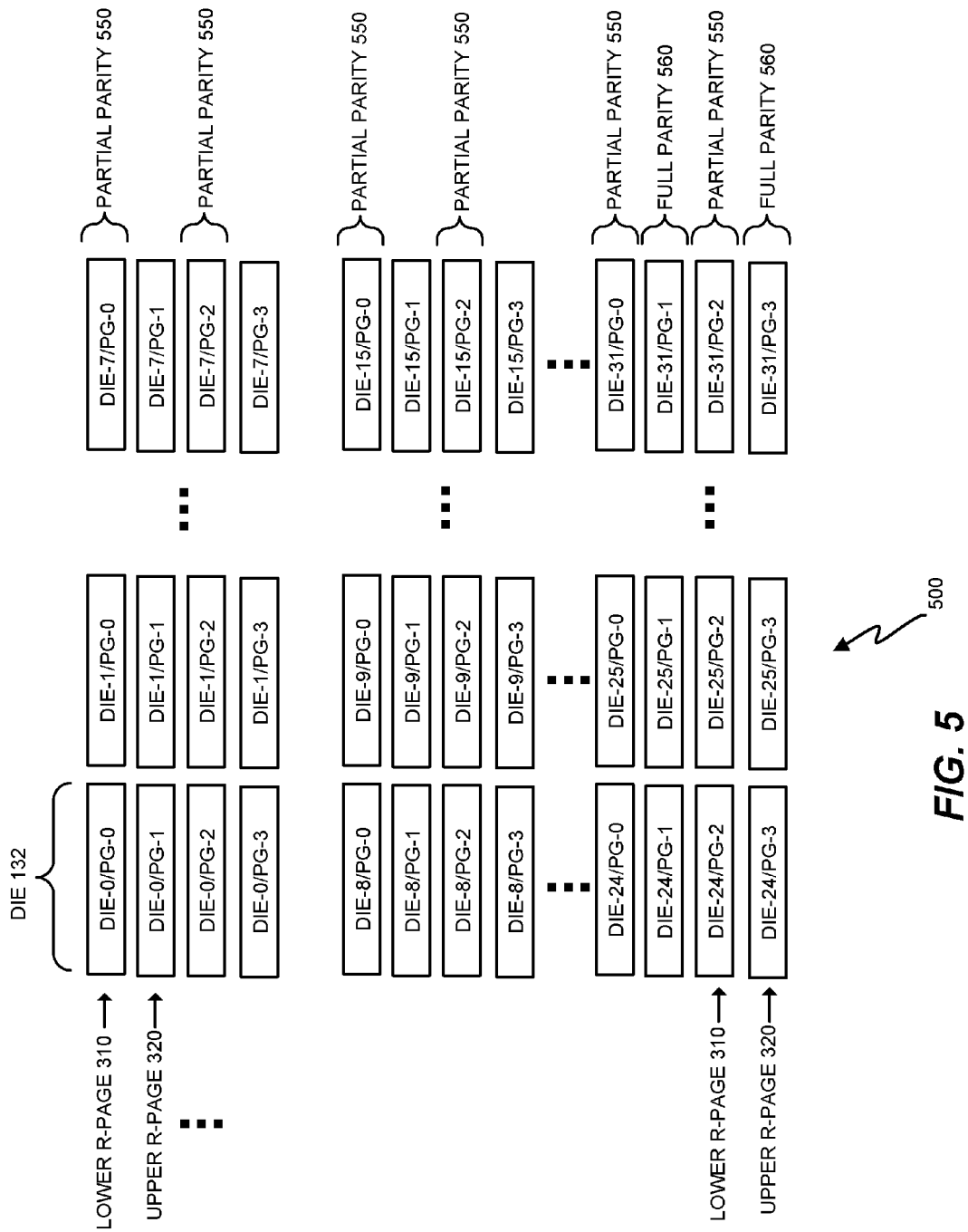
FIG. 5 is a block diagram illustrating a protection domain in an exemplary embodiment.

FIG. 5 is a block diagram of a protection domain 500 in an exemplary embodiment. Protection domain 500 defines erasure code generation for host data in MLC memory 150 which, in this example, includes thirty-two die 132 (die-0 through die-31) with 4 pages per die 132 (page-0 through page-3 for each die), where lower R-pages 310 link even pages across die 132 and upper-R pages 320 link odd pages across die 132.

To protect lower pages of MLC memory 150, erasure code module 124 implements lower R-page 310 protection based on a number of die 132 that are active at a time in MLC memory 150. Erasure code module 124 may determine the number of active die 132 based on one or more of a target write bandwidth, an amount of data (e.g., bytes) per write operation, and a programming time for MLC memory 150. Erasure code module 124 may then generate an erasure code for a lower R-page 310 according to the groups of active die 132 where each active die 132 is grouped with a proportional number of inactive die. In this example, erasure code module 124 determines that four die 132 are active at a time and implements a partial parity function 550 that encodes pg-0 from die-0 to die-7, pg-2 from die-0 to die-7, pg-0 from die-8 to die-15, pg-2 from die-8 to die-15, etc.

Erasure code module 124 may also implement upper R-page 320 protection for full R-page protection in MLC memory 150. Erasure code module 124 may generate erasure codes for upper R-pages 320 based on available buffer space in memory 122 of flash controller 120, programming sequences or technique, opportunities of die 132, or some combination thereof. In the case that upper R-page 320 protection is also implemented, the number of lower R-page 310 protection domains per R-page may be based at least in part on a number of upper R-pages 320 protection domains, and erasure code module 124 may determine the number of die 132 per lower R-page 310 protection domain based on the total available die 132 and the lower R-page 310 protection domains per R-page. In this example, full parity function 560 encodes pg-1 from die-0 to die-31 and pg-3 from die-0 to die-31. However, erasure code module 124 may select other encoding techniques or combinations of encoding techniques (e.g., lower R-page 310 protection only without upper R-page 320 protection). Furthermore, it will be appreciated that the particular arrangement of flash memory 300, MLC memory 150, protection domain 500, and number of components is exemplary for the purposes of discussion.

Returning to method 400 of FIG. 4, at step 404, erasure code module 124 records erasure codes 374 for host write data intended for lower pages of MLC memory 150 into checkpoint band 350 of SLC memory 140 based on the protection domain. Thus, as write data is received from host 102, erasure code module 124 may cache/accumulate/group write data in memory 122 into equal-sized strips of data units (e.g., flash page 138, block 136, R-page 310/320, or R-block 330) based on the number of active die 132 and generate an erasure code 374 for each data strip to store in checkpoint band 350 of SLC memory 140. The erasure code 374 written to checkpoint band 350 in SLC memory 140 may therefore have a direct correlation to host data activity in hot band 350 of MLC memory 150 and an appropriate corresponding size to efficiently correct the data that is at risk. Erasure code module 124 may program data from host 102 and a corresponding erasure code 374 simultaneously or in a sequential order.

In a case that erasure code module 124 implements full R-page protection (e.g., to support vendor-specified data recovery), erasure code module 124 may implement upper R-page 320 protection according to a pattern of die 132 in flash memory 300. For instance, in protection domain 500, erasure code module 124 may implement full parity 560 in an incrementing pattern across die-0/pg-0, die-1/pg-1, die-2/pg-2, etc. until die-31/pg-31 to ensure that one die 132 per page has an upper page program active so that a lower R-page 310 is able to cover a full R-page. Erasure code module 124 may store erasure codes 374 for full R-page protection to checkpoint band 370 of SLC memory 140 to reduce tenure and improve buffer performance in flash controller 120. Alternatively, upper R-page 320 protection may be transient and not stored in SLC memory 140 as lower R-page3 protection is stored in SLC memory 140 to reduce write amplification cost.

In step 406, flash controller 120 detects a power loss event. Flash controller 120 may be configured to determine the cause of an unexpected shutdown, assess the risk of lower page corruption in MLC memory 150, and/or initiate recovery procedures after power is restored to flash memory 300. Flash controller 120 may alternatively or additionally initiate a series of actions to be performed or directed by erasure code module 124 in response to an unexpected loss of power to flash memory 300.

In step 408, erasure code module 124 processes the data band (e.g., hot band 160) to identify corrupted lower page host data. Flash controller 120 may create checkpoints 372 in SLC memory 140 periodically and/or in response to commands received from host 102 or a specified amount of activity (e.g. a specified amount of host write data, map references, etc.). Erasure code module 124 may therefore reference checkpoints 372 in SLC memory 140 to determine which die 132, R-blocks 330 or R-pages 310/320 were being programmed when the power failure occurred to identify data that is potentially corrupted as a result of the power loss event. Alternatively or additionally, erasure code module 124 may access queues, tables, or other data structures stored in memory 122 and/or checkpoint band 350 that indicate a date or an order in which host data was written to MLC memory 150 to identify the data that is at risk of corruption.

In step 410, erasure code module 124 processes checkpoint band 370 in SLC memory 140. The association between erasure codes 374 and host data of MLC memory 150 may be stored in memory 122 and/or checkpoint band 370. Alternative or additionally, each erasure code 374 may include a header and an identifier to indicate associated host data. In any case, erasure code module 124 may identify/retrieve bits of erasure code 374 from checkpoint band 370 in SLC memory 140 that encode corresponding host data stored in MLC memory 150. The coded bits build redundancy into the system in an efficient manner since the original data (e.g., an R-page 310/320 or R-block 330 stored in MLC memory 150) may be reconstructed if any lower R-page 310 of host data is lost.

In step 412, erasure code module 124 reprocesses the corrupted lower page host data with the erasure codes 374. As described above, erasure code module 124 may implement a programming sequence in MLC memory 150 to ensure that each erasure code 374 recovers an R-page 310/320 for a group of active die 132. The recovery process may comprise any decoding technique such as parity, BCH, Reed Solomon, etc. to recover lower R-pages 310 of corrupted active die 132. Erasure code module 124 may reprogram the recovered lower R-page 310 in MLC memory 150 and/or reprogram an associated erasure code 374 in SLC memory 140. Erasure code module 124 may also update mapping or other association information in relation to the reprogramming.

In step 414, erasure code module 124 programs the upper page corresponding to the reprocessed lower page. And, in step 416, erasure code module 124 discards the erasure code for the lower page. That is, after both the lower page and upper page are programmed without a power failure the possibility of lower page data corruption is eliminated and erasure codes 374 may be discarded from SLC memory 140. In one embodiment, if R-Block 330 is available for recycle then all upper pages have been programmed and its corresponding erasure codes 374 may be safely discarded to limit write amplification factors. In another embodiment, when checkpoint band 370 is being recycled the drive statistics are checked to ensure that R-Block 330 in MLC memory 150 associated with erasure code 374 is available for recycle, and, as valid host data is recycled to cold data band 360 the associated erasure codes 374 are not recycled.

Figure 6:
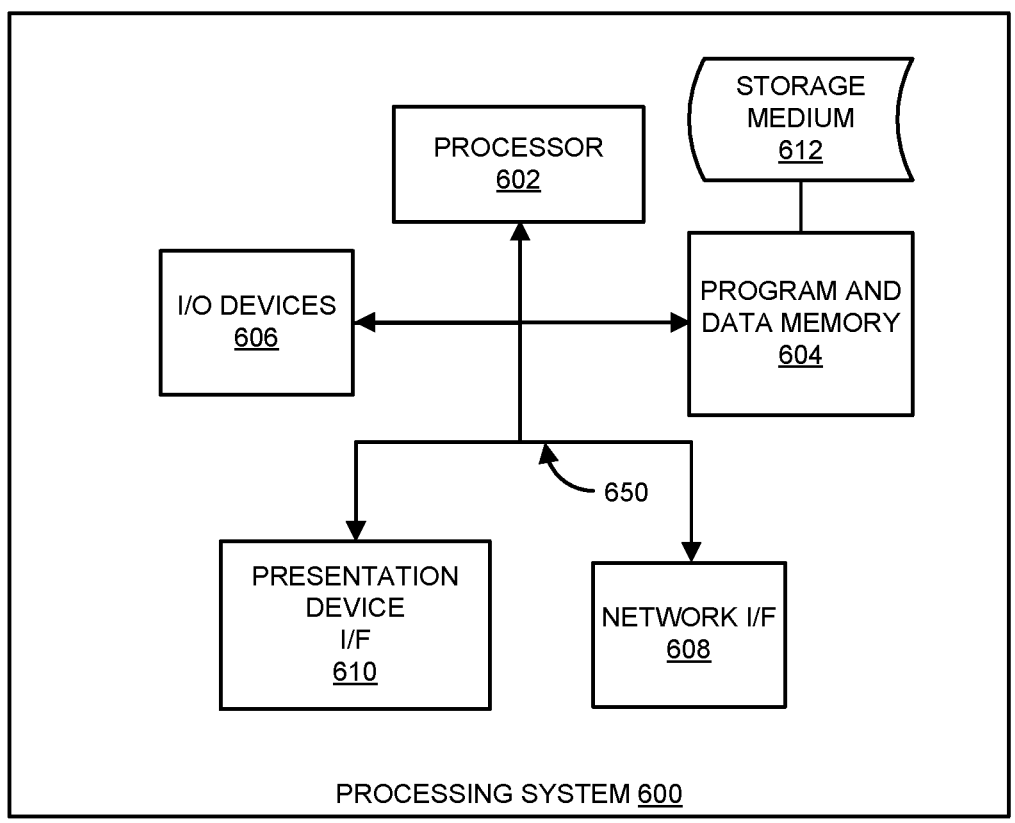
FIG. 6 is a block diagram illustrating an exemplary processing system operable to execute programmed instructions embodied on a computer readable medium.

Flash controller 120 and/or erasure code module 124 may perform the operations and functions described herein by executing one or more sequences of instructions stored on a machine/computer readable medium. Embodiments disclosed herein can take the form of software, hardware, firmware, or various combinations thereof to perform the various operations disclosed herein. FIG. 6 illustrates an exemplary processing system 600 operable to execute a computer readable medium embodying programmed instructions. Processing system 600 is operable to perform the above operations by executing programmed instructions tangibly embodied on computer readable storage medium 612. In this regard, embodiments of the invention can take the form of a computer program accessible via computer readable medium 612 providing program code for use by a computer or any other instruction execution system. For the purposes of this description, computer readable storage medium 612 can be anything that can contain or store the program for use by the computer.

Computer readable storage medium 612 can be an electronic, magnetic, optical, electromagnetic, infrared, or semiconductor device. Examples of computer readable storage medium 612 include a solid state memory, a magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD. The terms tangible or non-transitory refer to the medium itself (i.e., tangible, not a signal) as opposed to a limitation on data storage persistency (e.g., RAM vs. ROM).

Processing system 600, being suitable for storing and/or executing the program code, includes at least one processor 602 coupled to program and data memory 604 through a system bus 650. Program and data memory 604 can include local memory employed during actual execution of the program code, bulk storage, and cache memories that provide temporary storage of at least some program code and/or data in order to reduce the number of times the code and/or data are retrieved from bulk storage during execution.

Input/output or I/O devices 606 (including but not limited to keyboards, displays, pointing devices, etc.) can be coupled either directly or through intervening I/O controllers. Network adapter interfaces 608 may also be integrated with the system to enable processing system 600 to become coupled to other data processing systems or storage devices through intervening private or public networks. Modems, cable modems, IBM Channel attachments, SCSI, Fibre Channel, and Ethernet cards are just a few of the currently available types of network or host interface adapters. Presentation device interface 610 may be integrated with the system to interface to one or more presentation devices, such as printing systems and displays for presentation of presentation data generated by processor 602.

What is claimed is:

1. A flash storage device comprising:
Multi-Level Cell (MLC) flash memory;
Single-Level Cell (SLC) flash memory; and
a controller coupled to the MLC flash memory and the SLC flash memory, the controller configured to program host data to a lower page of the MLC flash memory, to generate an erasure code for the host data, and to store the erasure code in the SLC flash memory;
the controller further configured to detect an interrupted write operation to an upper page linked to the lower page, to retrieve the erasure code from the SLC flash memory, and to correct the host data of the lower page of the MLC flash memory using the erasure code; the MLC flash memory is configured to store host write operations; the SLC flash memory is configured to store checkpoint data; and the controller is further configured to generate the erasure code to cover a plurality of lower pages in the MLC flash memory, to manage a hot data band that stores the host write operations in the MLC flash memory, to manage a checkpoint band that stores the checkpoint data and the erasure code in the SLC flash memory, and to generate the erasure code to protect the plurality of lower pages corresponding to upper pages based on a group of die active at a time in a predetermined sequence, where each active die is grouped with a proportional number of inactive die.

2. The flash storage device of claim 1, wherein:
the controller is further configured to generate the erasure codes such that each erasure code corresponds to an R-page of the MLC memory.

3. The flash storage device of claim 1, wherein:
the controller is further configured to generate the erasure code based on one of a partial parity operation, a simple parity operation, a Bose-Chaudhuri-Hocquenghem operation, or a Reed Solomon operation.

4. The flash storage device of claim 1, wherein:
the MLC flash memory and the SLC flash memory comprise a NAND flash architecture.

5. A method comprising:
programming host data to a lower page of MLC flash memory of a flash memory array;
generating an erasure code for the host data;
storing the erasure code in SLC flash memory of the flash memory array;
detecting an interrupted write operation to an upper page linked to the lower page;
retrieving the erasure code from the SLC flash memory; correcting the host data to the lower page of the MLC flash memory using the erasure code; storing host write operations in the MLC flash memory; storing checkpoint data in the SLC flash memory; generating the erasure code to cover a plurality of lower pages in the MLC flash memory; managing a hot data band that stores the host write operations in the MLC flash memory; managing a checkpoint band that stores the checkpoint data and the erasure code in the SLC flash memory; and generating the erasure code to protect the plurality of lower pages corresponding to upper pages based on a group of die active at a time in a predetermined sequence, where each active die is grouped with a proportional number of inactive die.

6. The method of claim 5, further comprising:
generating the erasure codes such that each erasure code corresponds to an R-page of the MLC memory.

7. The method of claim 5, further comprising:
generating the erasure code based on one of a partial parity operation, a simple parity operation, a Bose-Chaudhuri-Hocquenghem operation, or a Reed Solomon operation.

8. The method of claim 5, wherein:
the MLC flash memory and the SLC flash memory comprise a NAND flash architecture.

9. A non-transitory computer readable medium embodying programmed instructions which, when executed by a processor, are operable for performing a method comprising:
programming host data to a lower page of MLC flash memory of a flash memory array;
generating an erasure code for the host data;
storing the erasure code in SLC flash memory of the flash memory array;
detecting an interrupted write operation to an upper page linked to the lower page;
retrieving the erasure code from the SLC flash memory; correcting the host data to the lower page of the MLC flash memory using the erasure code; storing host write operations in the MLC flash memory; storing checkpoint data in the SLC flash memory; generating the erasure code to cover a plurality of lower pages in the MLC flash memory; managing a hot data band that stores the host write operations in the MLC flash memory; managing a checkpoint band that stores the checkpoint data and the erasure code in the SLC flash memory; and generating the erasure code to protect the plurality of lower pages corresponding to upper pages based on a group of die active at a time in a predetermined sequence, where each active die is grouped with a proportional number of inactive die.

10. The non-transitory computer readable medium of claim 9, the method further comprising:
generating the erasure codes such that each erasure code corresponds to an R-page of the MLC memory.

11. The non-transitory computer readable medium of claim 9, the method further comprising:
generating the erasure code based on one of a partial parity operation, a simple parity operation, a Bose-Chaudhuri-Hocquenghem operation, or a Reed Solomon operation.

* * * * *